United States Patent
Young et al.

(10) Patent No.: US 11,282,945 B2
(45) Date of Patent: Mar. 22, 2022

(54) NEGATIVE-CAPACITANCE FIELD EFFECT TRANSISTOR

(71) Applicant: Taiwan Semiconductor Manufacturing Co., Ltd., Hsinchu (TW)

(72) Inventors: Bo-Feng Young, Hsinchu (TW); Chih-Yu Chang, Hsinchu (TW); Sai-Hooi Yeong, Hsinchu County (TW); Chi On Chui, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 44 days.

(21) Appl. No.: 16/596,059

(22) Filed: Oct. 8, 2019

(65) Prior Publication Data

US 2020/0176585 A1    Jun. 4, 2020

Related U.S. Application Data

(60) Provisional application No. 62/772,666, filed on Nov. 29, 2018.

(51) Int. Cl.
*H01L 29/66* (2006.01)
*H01L 29/51* (2006.01)
*H01L 29/78* (2006.01)

(52) U.S. Cl.
CPC ........ *H01L 29/6684* (2013.01); *H01L 29/513* (2013.01); *H01L 29/516* (2013.01); *H01L 29/66545* (2013.01); *H01L 29/66795* (2013.01); *H01L 29/7851* (2013.01)

(58) Field of Classification Search
CPC . H01L 29/6684; H01L 29/513; H01L 29/516; H01L 29/66545; H01L 29/66795; H01L 29/7851
See application file for complete search history.

(56) References Cited

U.S. PATENT DOCUMENTS

| | | | |
|---|---|---|---|
| 2019/0355584 A1* | 11/2019 | Yamaguchi | G11C 11/2259 |
| 2020/0098925 A1* | 3/2020 | Dewey | H01L 29/78 |
| 2020/0365618 A1* | 11/2020 | Zhang | H01L 27/11597 |

OTHER PUBLICATIONS

Maisonneuve, V. et al., "Room-temperature crystal structure of the layered phase $Cu^I In^{III} P_2 S_6$," Journal of Alloys and Compounds, 218, Received Feb. 2, 1994, in final form May 19, 1994, published Mar. 1, 1995, pp. 157-164.

* cited by examiner

*Primary Examiner* — Christine A Enad
(74) *Attorney, Agent, or Firm* — Haynes and Boone, LLP

(57) ABSTRACT

Circuit devices and methods of forming the same are provided. In one embodiment, a method includes receiving a workpiece that includes a substrate and a fin extending from the substrate, forming a first ferroelectric layer on the fin, forming a dummy gate structure over a channel region of the fin, forming a gate spacer over sidewalls of the dummy gate structure, forming an inter-level dielectric layer over the workpiece, removing the dummy gate structure to expose the first ferroelectric layer over the channel region of the fin, and forming a gate electrode over the exposed first ferroelectric layer over the channel region of the fin.

20 Claims, 18 Drawing Sheets

NEGATIVE-CAPACITANCE FIELD EFFECT TRANSISTOR

PRIORITY DATA

The This application claims the benefit of U.S. Provisional Application No. 62/772,666, filed Nov. 29, 2018, the entirety of which is incorporated by reference herein.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, advances in fabrication have enabled three-dimensional designs, such as Fin-like Field Effect Transistors (FinFETs). A FinFET may be envisioned as a typical planar device extruded out of a substrate and into the gate. An exemplary FinFET is fabricated with a thin "fin" (or fin structure) extending up from a substrate. Source/drain features are formed in this vertical fin by doping the fin material or by recessing the fin material and epitaxially growing the source/drain features in its place.

The remaining portions of the fin may form channel regions between the source/drain features, and a gate is provided over (e.g., wrapping around) the channel region of the fin. Wrapping the gate around the fin increases the contact area between the channel region and the gate and allows the gate to control the channel from multiple sides. This can be leveraged in a number of ways, and in some applications, FinFETs provide reduced short channel effects, reduced leakage, and higher current flow. In other words, they may be faster, smaller, and more efficient than planar devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
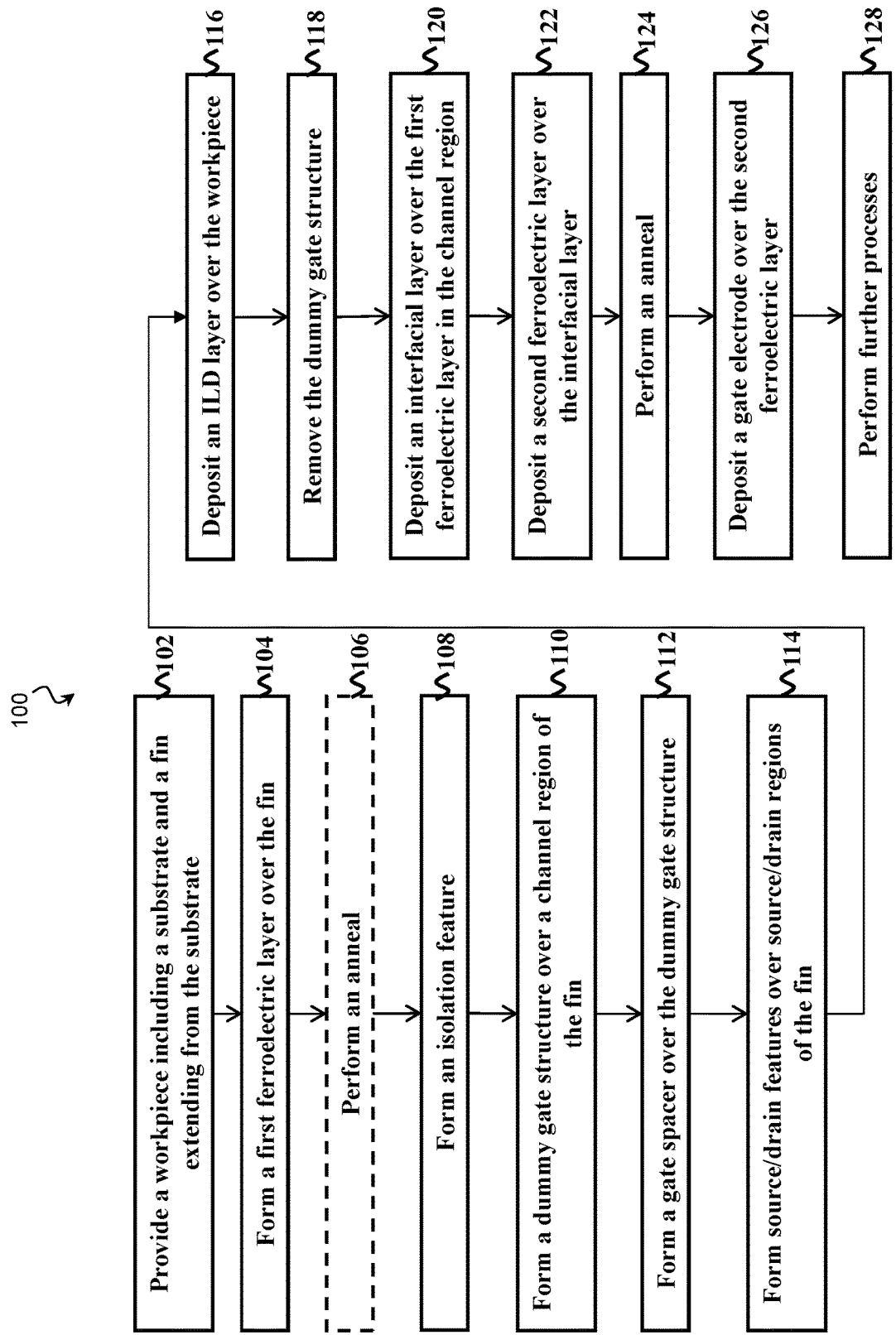
FIG. 1 is a flowchart of an example method for fabricating a semiconductor device constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure provides examples of an integrated circuit that includes field effect transistors (FET) with gate structures that includes more than one ferroelectric layers. Under certain switching conditions, the ferroelectric behavior of such gate structures produce a negative gate capacitance, and thus the transistors may be referred to Negative Capacitance Field Effect Transistors (NCFETs). Compared to conventional FETs with any ferroelectric layers, NCFETs may have a reduced subthreshold swing, a property that relates to the amount of voltage used to switch a device on and off and the operating speed of the device. In other words, NCFETs may switch faster. NCFETs may also have reduced power and a better (e.g., higher) $I_{on}/I_{off}$ current ratio. The present disclosure also provides examples of an integrated circuit that includes FETs that include a first ferroelectric layer epitaxially formed on the fin active region and a second ferroelectric layer in physical contact with the gate electrode. The first ferroelectric layer can produce a hysteresis curve to counteract the hysteresis curve of the second ferroelectric layer, thereby achieving a hysteresis-free FET or a substantially hysteresis-free FET.

FIG. 1 is a flow chart of a method 100 for fabricating a semiconductor device or an integrated circuit (IC) device that includes a plurality of transistors, such as a plurality of FinFETs. Method 100 will be described in conjunction with diagrammatic perspective view and cross-sectional views of a workpiece 200 shown in FIGS. 2-18. FIGS. 3-7 and 17 are cross-sectional views of the workpiece 200 along section A-A' shown in FIG. 2. FIGS. 8-16 and 18 are cross-sectional views of the workpiece 200 along section B-B' shown in FIG. 2. Additional steps may be provided before, during, and after method 100, and some of the steps described can be moved, replaced, eliminated for additional embodiments of method 100.

Figure 2:
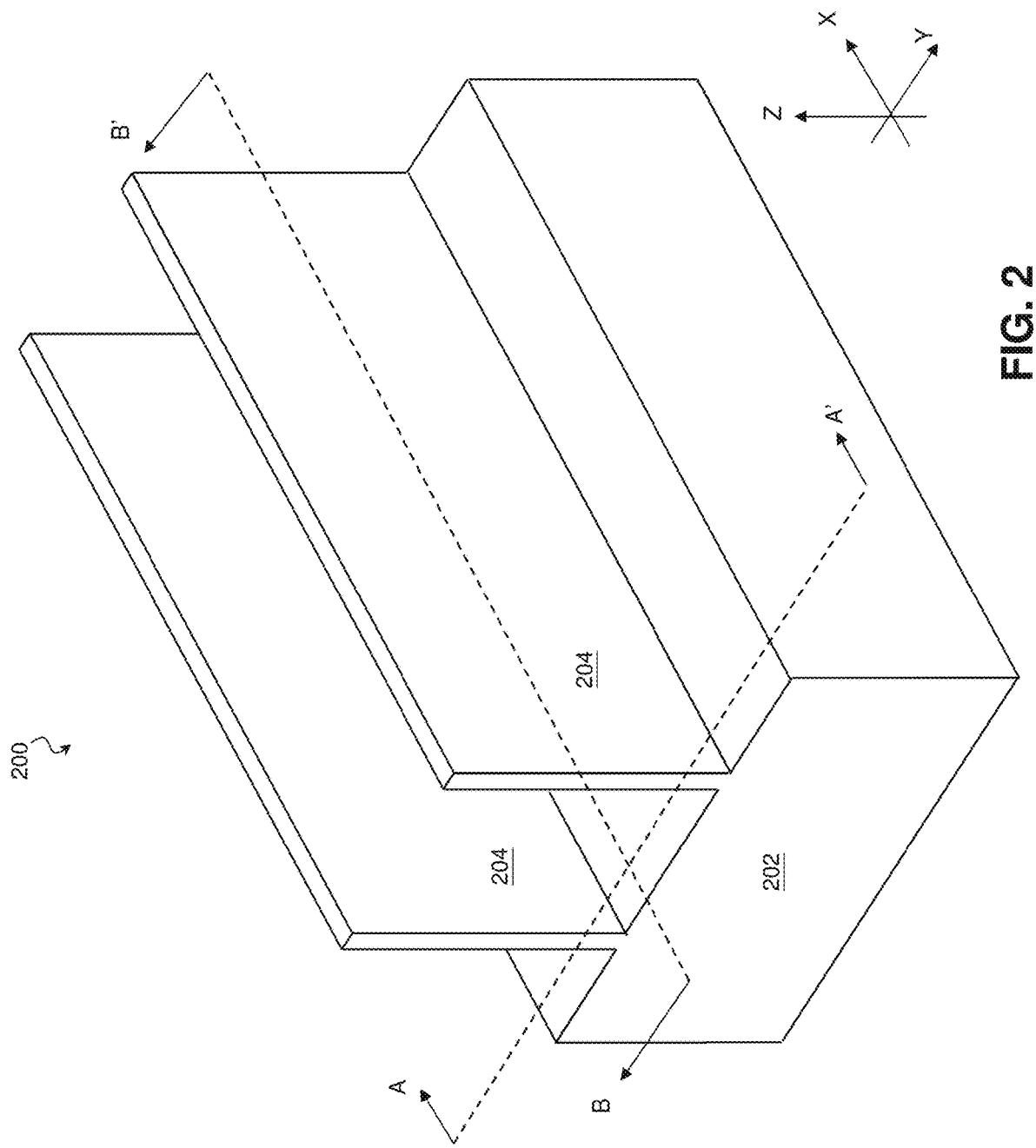
FIG. 2 is a prospective view of a workpiece having fins according to various aspects of the present disclosure.
Figure 3:
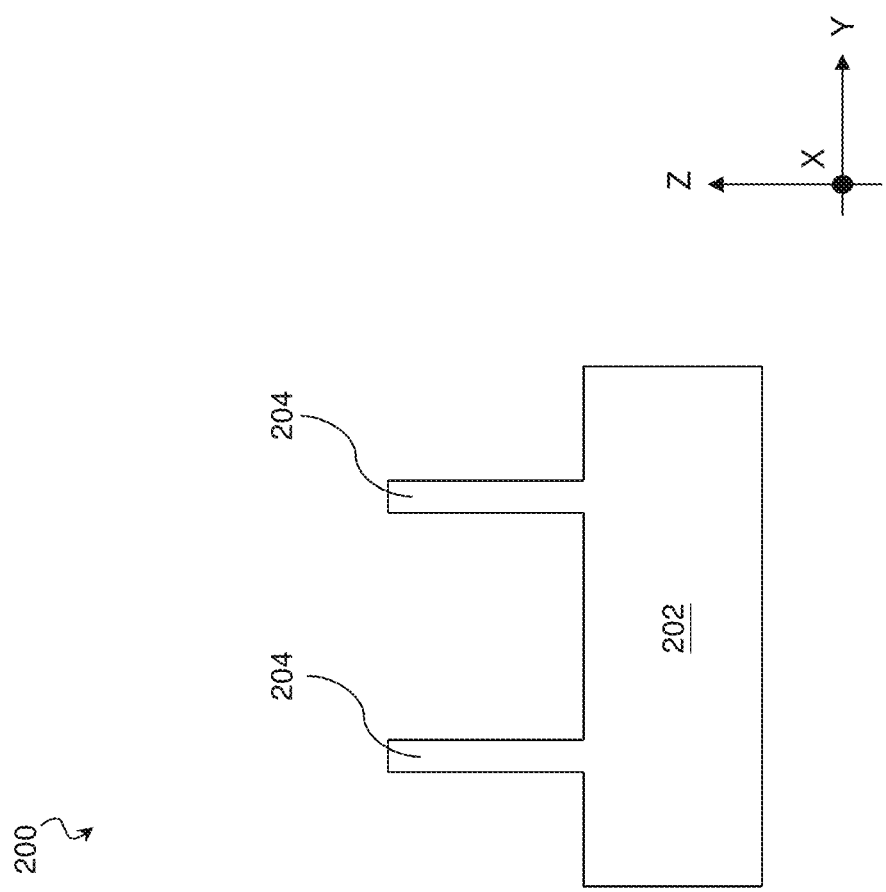
FIGS. 3-18 are cross-sectional views of an example semiconductor device in accordance with some embodiments of the present disclosure.

Referring now to FIGS. 1, 2 and 3, method 100 of the present disclosure includes block 102, where a workpiece 200 is provided. The workpiece 200 includes a fin 204 extending from a substrate 202. In FIG. 3, the fin 204 extends parallel to a top surface of the substrate 202 along the X direction. The substrate 202 represents any structure upon which circuit devices may be formed. In various examples, the substrate 202 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be uniform in composition or may include various layers, some of which may be selectively etched to form the raised features, such as fins. The layers may have similar or different compositions, and in various embodiments, some substrate layers have non-uniform compositions to induce device strain and thereby tune device performance. Examples of layered substrates include silicon-on-insulator (SOI) substrates. In some such examples, a layer of the substrate 202 may include an insulator such as a semiconductor oxide, a semiconductor nitride, a semiconductor oxynitride, a semiconductor carbide, and/or other suitable insulator materials.

Doped regions, such as wells, may be formed on the substrate 202. In that regard, some portions of the substrate 202 may be doped with p-type dopants, such as boron, $BF_2$, or indium while other portions of the substrate 202 may be doped with n-type dopants, such as phosphorus or arsenic; and/or other suitable dopants including combinations thereof.

In some examples, the devices to be formed on the substrate 202 extend out of the substrate 202. For example, FinFETs and/or other non-planar devices may be formed on fins (or device fins) 204 disposed on the substrate 202. The device fins 204 are representative of any raised feature and include FinFET device fins 204 as well as fins 204 for forming other raised active and passive devices upon the substrate 202. The fins 204 may be similar in composition to the substrate 202 or may be different therefrom. For example, in some embodiments, the substrate 202 may include primarily silicon, while the fins 204 include one or more layers that are primarily germanium or a SiGe semiconductor. In some embodiments, the substrate 202 includes a SiGe semiconductor, and the fins 204 include a SiGe semiconductor with a different ratio of silicon to germanium than the substrate 202.

The fins 204 may be formed by etching portions of the substrate 202, by depositing various layers on the substrate 202 and etching the layers, and/or by other suitable techniques. For example, the fins 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 202. The sacrificial layer is patterned using a photolithography process. Spacers are formed alongside the patterned sacrificial layer using a self-aligned process. The sacrificial layer is then removed, and the remaining spacers are used to pattern the fins 204 by removing material of the substrate 202 that is not covered by the spacers so that the fins 204 remain.

Figure 4:
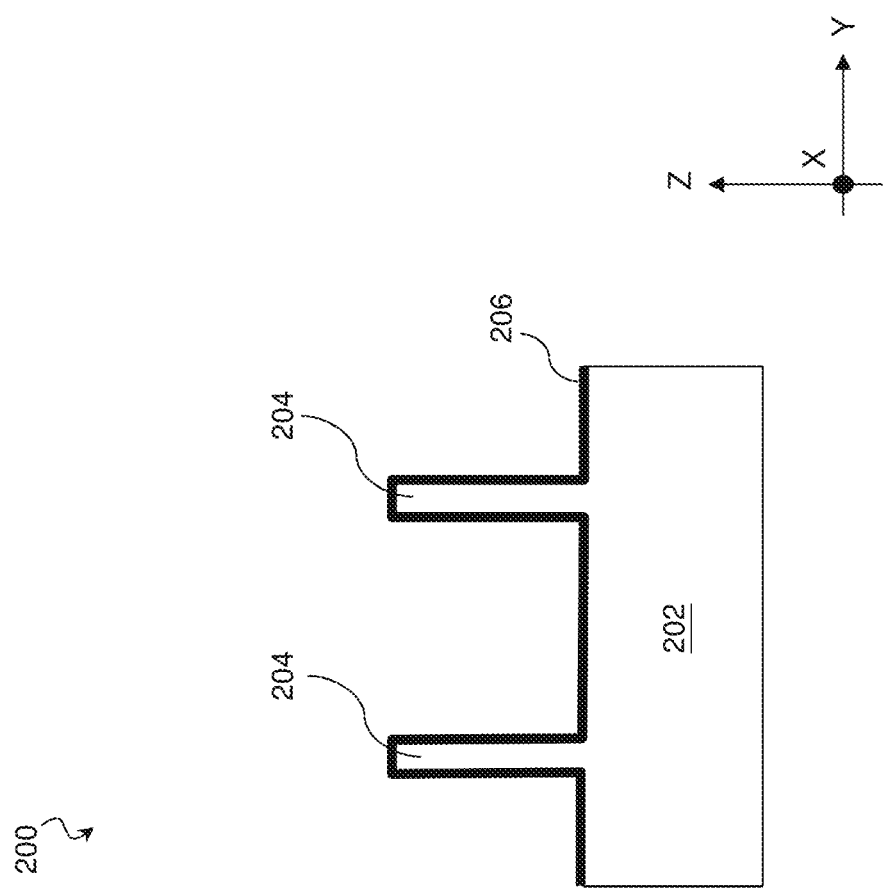

Referring now to FIGS. 1 and 4, method 100 includes block 104 where a first ferroelectric layer 206 is formed over the fin 204. Because the first ferroelectric layer 206 is formed on the fin-side (adjacent the fin 204), the first ferroelectric layer 206 constitutes a part of the channel. In some embodiments, the first ferroelectric layer 206 include semiconductor property. In some embodiments, the first ferroelectric layer 206 is formed of a material that has semiconductor property. As will be described below, the second ferroelectric layer (232, FIG. 14) is formed of a ferroelectric material that does not have semiconductor property and is therefore different from the first ferroelectric layer 206. That is, in embodiments of the present disclosure, materials for the second ferroelectric layer 232 may not be suitable forming the first ferroelectric layer 206.

The first ferroelectric layer 206 includes compounds including indium (In), selenium (Se), copper (Cu), phosphorous (P), strontium (Sr), titanium (Ti), oxygen (O), chromium (Cr), or sulfur (S). The material for the first ferroelectric layer 206 exhibits ferroelectricity and does not have a perovskite structure as does the material for the second ferroelectric layer 232 (to be described below). Ferroelectricity is a characteristic of materials that have a spontaneous electric polarization that can be reversed by the application of an external electric field. A distinguishing feature of a ferroelectric material is that its polarization is dependent not only on the current electric field being applied but also on its history, yielding a hysteresis loop. In some embodiments, the material for the first ferroelectric layer 206 is oxygen-free and may be categorized as non-oxide ferroelectric material. In some instances, the first ferroelectric layer 206 may consist essentially of indium selenide ($In_2Se_3$) or copper indium thiophosphate ($CuInP_2S_6$). In some other instances, the first ferroelectric layer 206 may be other transition metal thiophosphate materials, such as $CuInP_2Se_6$, $CuCrP_2S_6$, or $CuCrP_2Se_6$. In embodiments represented in FIG. 4, the first ferroelectric layer 206 is formed on the top surface of the substrate 202, the top surfaces of the fins 204, and the sidewalls of the fins 204.

In some embodiments where the first ferroelectric layer 206 includes indium selenide ($In_2Se_3$), it may be formed epitaxially by using suitable epitaxy technique, such as vapor-phase epitaxy (VPE), molecular beam epitaxy (MBE), other suitable epitaxy processes, or combinations thereof. When the material of the first ferroelectric layer 206, on the one hand, and material of the fin 204 and the substrate 202, on the other, have a mismatch, the first ferroelectric layer 206 may be kept thin to prevent substantial lattice defect in the first ferroelectric layer 206. In alternative embodiments, instead of epitaxially growing the first ferroelectric layer 206 directly on the substrate 202 and the fin 204, a buffer layer may be formed over the substrate 202 and the fin 204 to bridge the lattice constant difference between the first ferroelectric layer 206 and the substrate 202 and the fin 204. That is, the buffer layer, when needed, has a lattice constant between the lattice constant of the material of the substrate 202/fin 204 and that of the first ferroelectric layer 206.

In some embodiments where the first ferroelectric layer 206 is formed of a transition metal thiophosphate material, the transition metal thiophosphate material may be formed into a solid and then exfoliated to form flakes to be coated or distributed over the fin 204. In these embodiments, the transition metal thiophosphate material may be form by solid state reaction. For example, stoichiometric portion of copper, indium, phosphorous, and sulfur may be placed in a furnace to form a solid of copper indium thiophosphate (CuInP$_2$S$_6$) and the solid is exfoliated to form flakes to be coated or deposited on the fin 204. In some other instances, the first ferroelectric layer 206 may be formed of a transition metal thiophosphate material and still be formed epitaxially on the fin 204. In still other instances, elements of a transition metal thiophosphate material may be deposited over the fin by sputtering in a stoichiometric ratio and then are solidify in the anneal process 205 at block 106.

Figure 5:
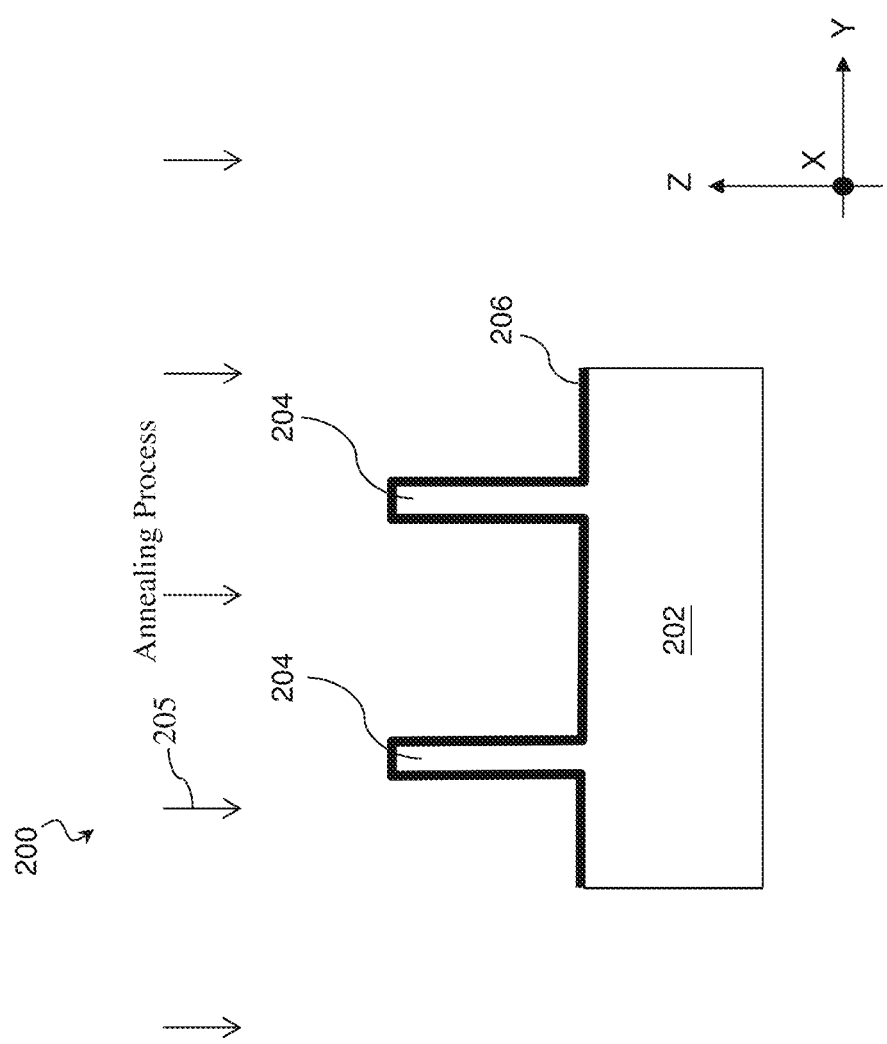

Referring still to FIGS. 1 and 5, method 100 includes block 106 where an anneal process 205 is performed to crystallize or enhance the epitaxial quality of the first ferroelectric layer 206 such that the first ferroelectric layer 206 exhibits ferroelectric property or exhibits stronger ferroelectric property. In some implementations, the anneal process 205 may be performed using a suitable anneal technique, such as rapid thermal anneal (RTA) or laser annealing. A temperature of the anneal process 205 depends on the composition of the first ferroelectric layer 206. In some instances, the temperature of the anneal process 205 at block 106 is between about 100° C. and about 700° C. Depending on the composition of the first ferroelectric layer 206, the described temperature range is needed to transform the material of the first ferroelectric layer 206 into a desirable phase of crystallinity or to remove defect from the first ferroelectric layer 206. The anneal process 205 at block 106 is optional and for that reason, block 106 is illustrated using dotted lines.

Figure 6:
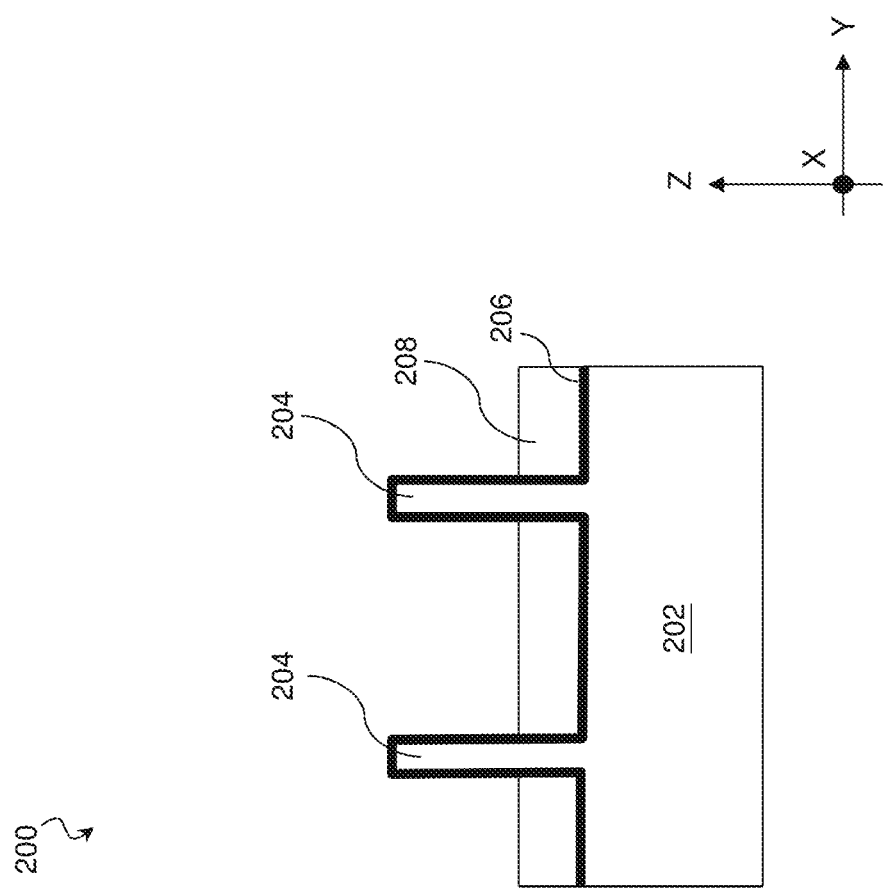

Referring now to FIGS. 1 and 6, method 100 includes block 108 where an isolation feature 208 is formed over the substrate 202 and among the fins 204. The isolation features 208 may be referred to as shallow trench isolation (STI) features 208 (or STI 208). The isolation feature 208 may include a dielectric material such as a semiconductor oxide, a semiconductor nitride, a semiconductor oxynitride, a semiconductor carbide, a semiconductor carbonitride, a semiconductor oxycarbonitride, a metal oxide, etc., and in some examples, the isolation feature 208 includes multiple sublayers of different dielectric materials. The isolation feature 208 may be formed by any suitable process, and in some examples, the isolation feature 208 is deposited using Atomic Layer Deposition (ALD), Plasma Enhanced ALD (PEALD), Chemical Vapor Deposition (CVD), Plasma Enhanced CVD (PECVD), High-Density Plasma CVD (HDP-CVD), and/or other suitable deposition processes. Following deposition, the isolation feature 208 may be etched back so that the uppermost portions of the fins 204 protrude above the isolation feature 208. In various such examples, the fins 204 extend between about 100 nm and about 500 nm above the topmost surface of the isolation feature 208. In some embodiments represented in FIG. 6, the isolation feature 208 is formed directly on the first ferroelectric layer 206.

Figure 7:
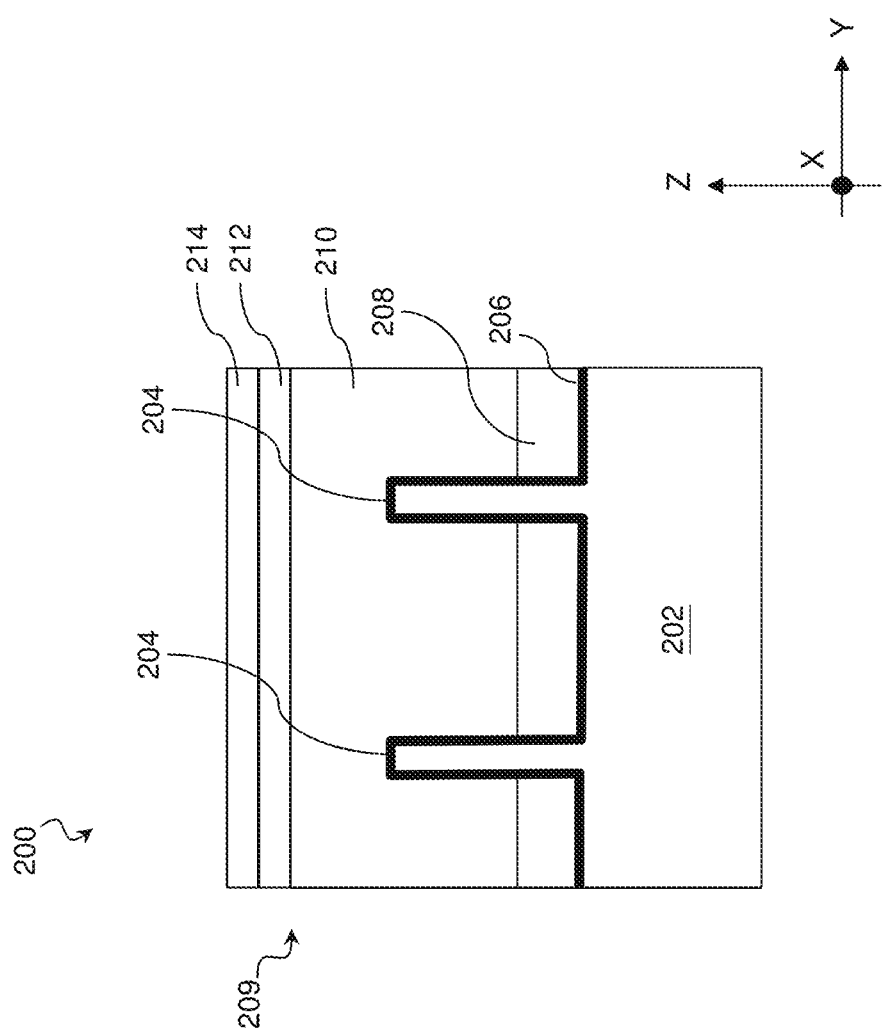
Figure 8:
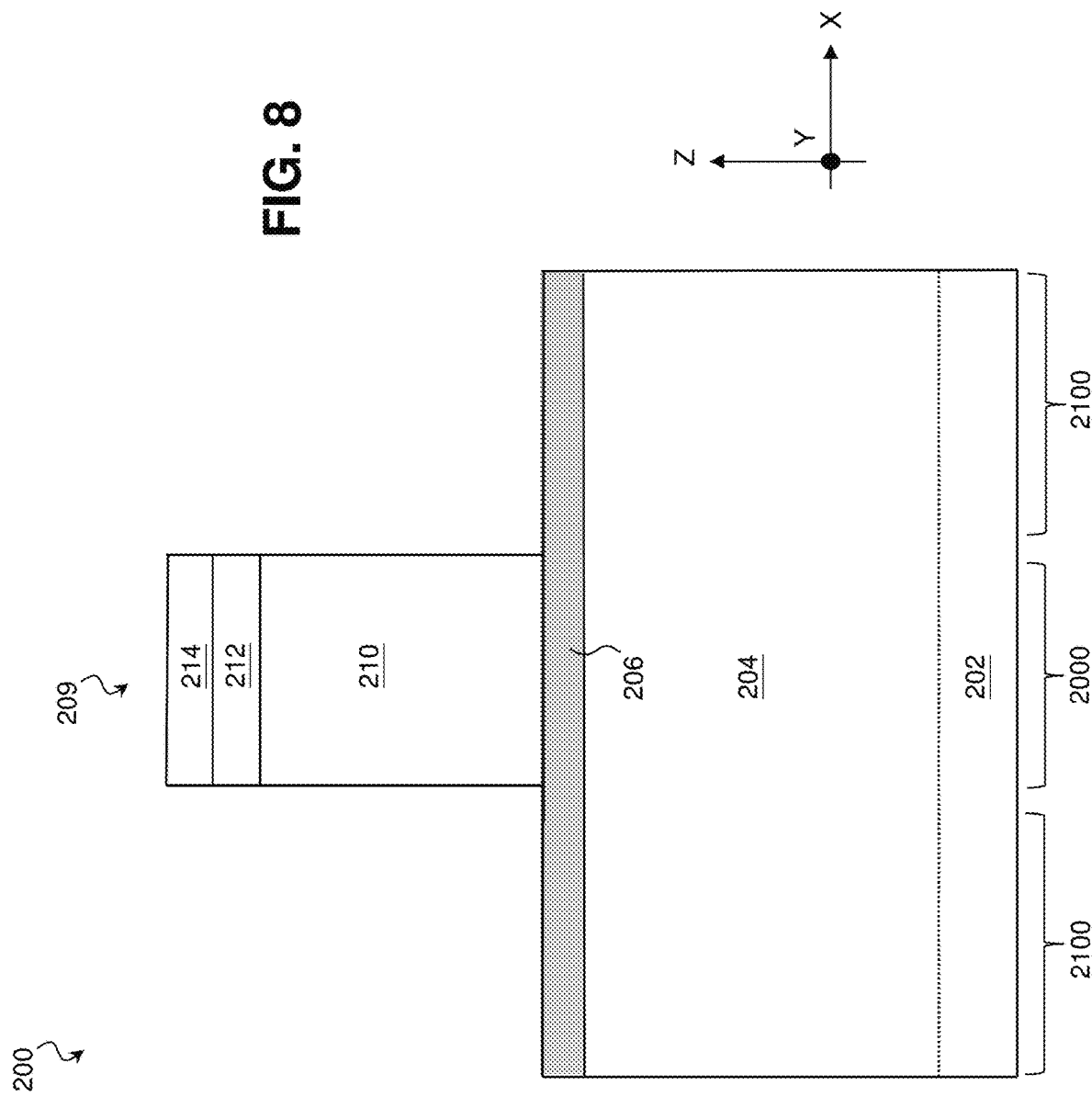

Referring now to FIGS. 1, 7 and 8, method 100 includes block 110 where a dummy gate structure 209 is formed over a channel region 2000 of the fin 204. When materials of the functional gate electrodes (to be described below) are sensitive to fabrication processes or are difficult to pattern, dummy gate structures 209 of polysilicon, dielectric, and/or other resilient material may be used during some of the fabrication processes. The dummy gate structures 209 are later removed and replaced with elements of functional gate electrodes (e.g., a gate electrode, a gate dielectric layer, an interfacial layer, etc.) in a gate-last process. In this way, the dummy gate structures 209 reserve area for the forthcoming functional gate electrodes.

FIG. 7 is a cross-sectional view of the workpiece 200 along the length of the fins 204, which extends along the X-direction. In FIG. 7, the dummy gate structure 209 extends along the Y-direction, which is perpendicular to the length-wise direction (X-direction) of the fins 204. FIG. 8 is an enlarged cross-sectional view of the workpiece 200 along the length of the dummy gate structure 209, which extends along the Y-direction. In FIG. 8, the fins 204 extends along the X-direction. In an example where the fins 204 extend between about 100 nm and about 500 nm above the topmost surface of the isolation feature 208, the dummy gate structure 209 extends between about 50 nm and about 150 nm from the upper-most surface of the fins 204. In some embodiments represented in FIGS. 7 and 8, the dummy gate structure 209 includes a dummy gate electrode 210. The dummy gate electrode 210 may include any suitable material, such as polysilicon, one or more dielectric materials (e.g., a semiconductor oxide, a semiconductor nitride, a semiconductor oxynitride, a semiconductor carbide, a semiconductor carbonitride, a semiconductor oxycarbonitride, etc.), and/or other suitable material. The material of the dummy gate electrode may be formed by any suitable process including CVD, PECVD, HDP-CVD, Physical Vapor Deposition (PVD), ALD, PEALD, and/or other suitable deposition processes. In some examples, the material of the dummy gate electrode 210 is deposited in a blanket deposition and etched to selectively remove portions of the material so that the dummy gate electrode 210 remain over the channel region 2000 of the fin 204. To aid in patterning, one or more gate hard mask layers of dielectric material or other suitable material, such as first gate hard mask 212 and a second gate hard mask 214, may be formed on top of the dummy gate electrode 210 prior to etching. The gate hard mask layers may have similar or different compositions, and in an example shown in FIGS. 7 and 8, the first gate hard mask layer 212 includes a semiconductor nitride, such as silicon nitride, and the second gate hard mask layer includes a semiconductor oxide, such as silicon oxide.

In some embodiments, the dummy gate structure 209 may also include a dummy gate dielectric layer to interface with the first ferroelectric layer 206 on the fin 204. To form functional gate electrodes, dummy gate structure may first be formed over and surrounding channel regions 2000 of the fins 204. In those embodiments, the material of the dummy gate dielectric layer is formed over the first ferroelectric layer 206 before the material of the dummy gate electrode 210 is deposited and material of the dummy gate electrode 210 is deposited on the dummy gate dielectric layer. In some instances, the material of the dummy gate dielectric layer may include a semiconductor oxide, such as silicon oxide.

Figure 9:
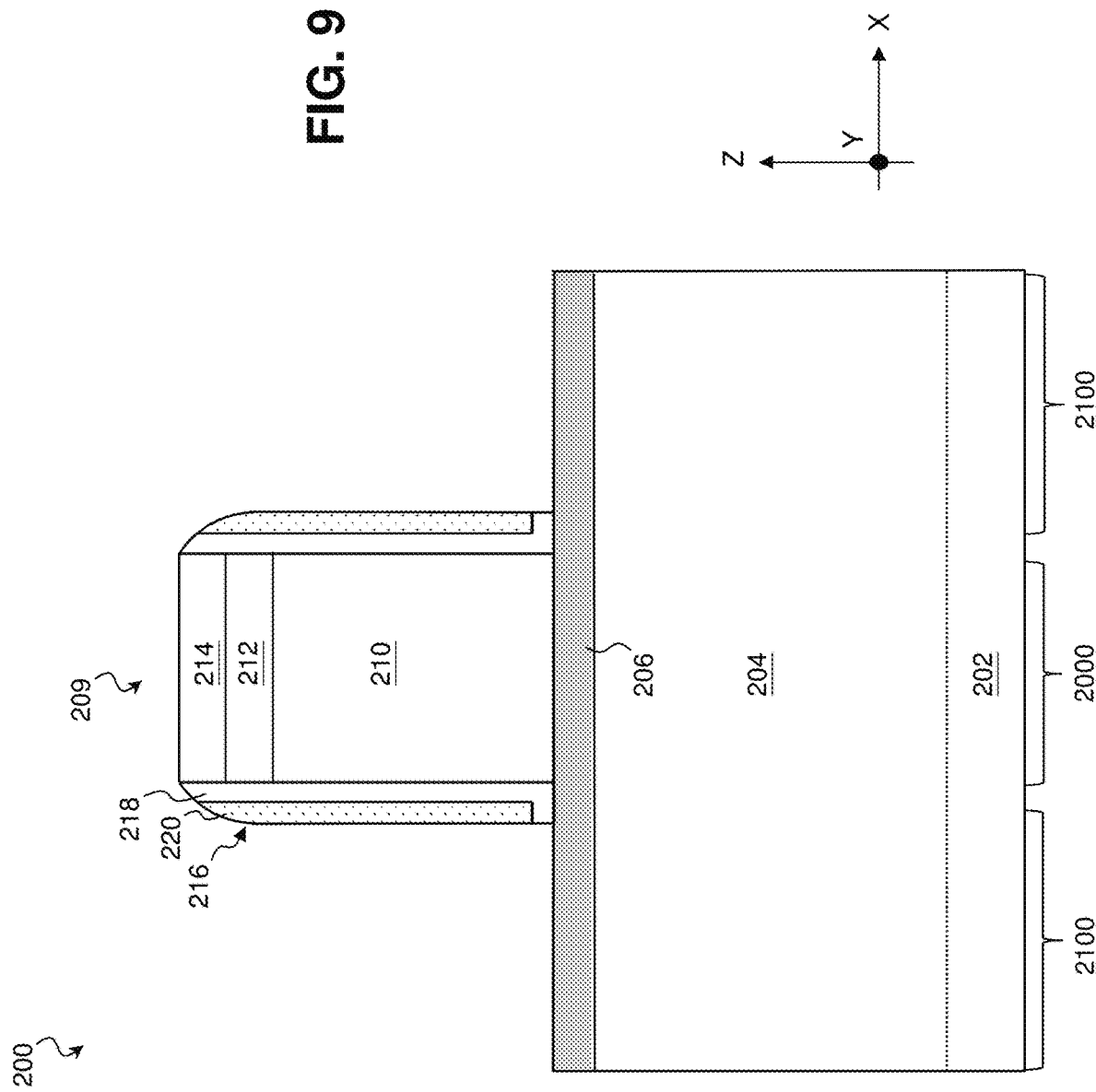

Referring now to FIGS. 1 and 9, method 100 includes block 112 where a gate spacer 216 is formed over the dummy gate structure 209. Gate spacers 216 are formed on side surfaces of the dummy gate structure 209, including side surfaces of the dummy gate electrode 210, the first gate hard mask 212, and the second gate hard mask 214. In various examples, the gate spacer 216 includes one or more layers of suitable materials, such as a dielectric material (e.g., a semiconductor oxide, a semiconductor nitride, a semiconductor oxynitride, a semiconductor carbide, a semiconductor oxycarbonitride, etc.). In some such examples, as those represented in FIG. 9, the gate spacer 216 includes a first spacer layer 218 of a low-k dielectric material (e.g., SiCN, SiOC, SiOCN, etc.) and a second spacer layer 220 of the same or another low-k dielectric material. In the example, the first spacer layer 218 has a thickness between about 1 nm and about 5 nm and the second spacer layer 220 has a thickness between about 1 nm and about 5 nm.

The first and second gate spacer layers 218 and 220 may be formed using any suitable deposition technique (e.g., ALD, CVD, HDP-CVD, etc.). In an example, the first and second gate spacer layers 218 and 220 are deposited on the dummy gate structure 209, the first ferroelectric layer 206 deposited on the fins 204, and the isolation feature 208 using a conformal deposition technique. The first and second gate spacer layers 218 and 220 are then anisotropically/selectively etched to remove them from the horizontal surfaces of the first ferroelectric layer 206 deposited on the fins 204, the isolation feature 208, and first and second gate hard masks 212 and 214 while leaving them on the vertical surfaces (or sidewalls) of the dummy gate structure 209. The remaining material defines the gate spacer 216. The etching process may be performed using any suitable etching method, such as anisotropic dry etching, wet etching, Reactive Ion Etching (RIE), and/or other etching methods and may use any suitable etchant chemistries. The etching methods and the etchant chemistries may vary as the first and second gate spacer layers 218 and 220 are etched to target the particular material being etched while minimizing unintended etching of the materials not being targeted.

Figure 10:
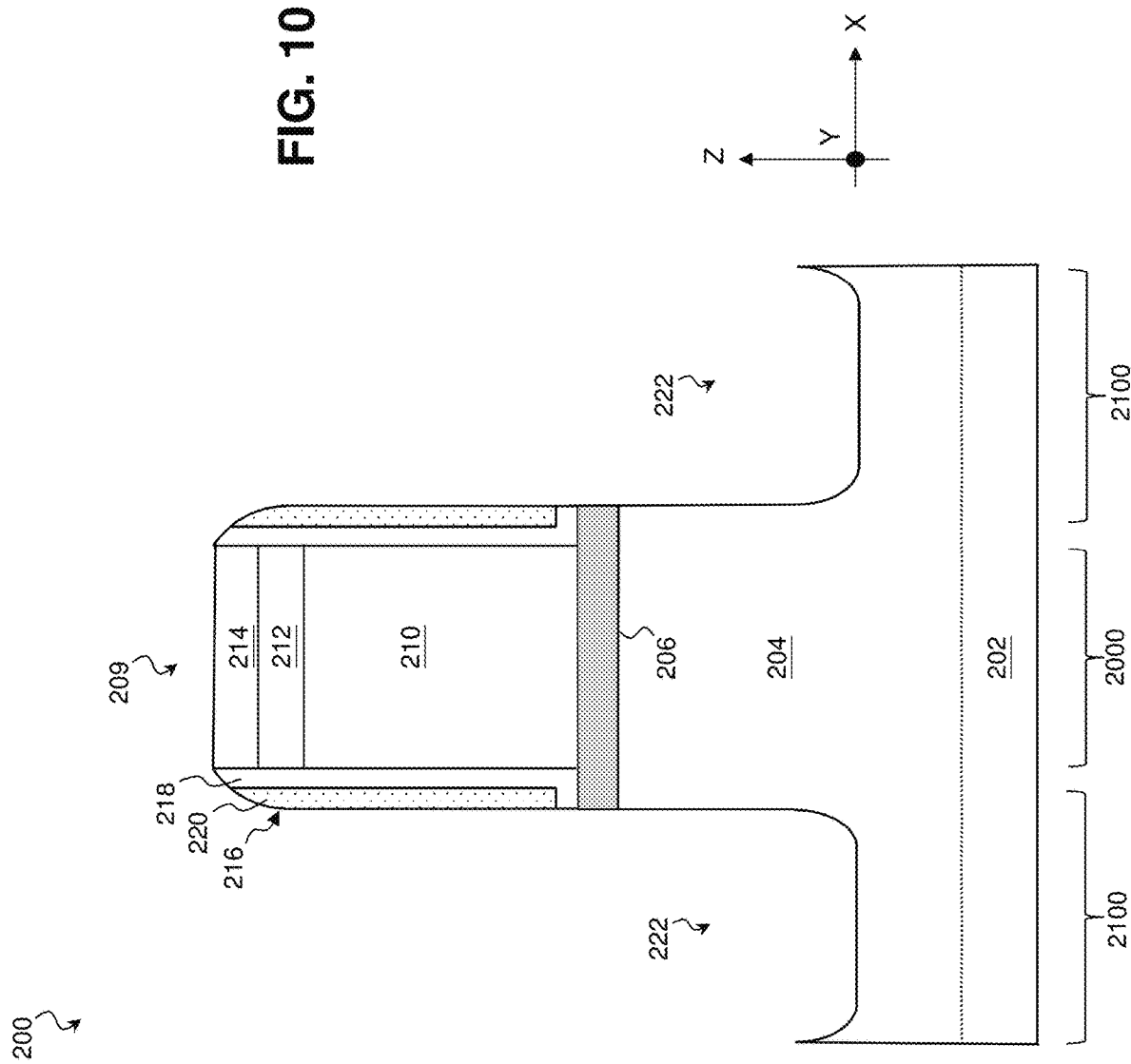
Figure 11:
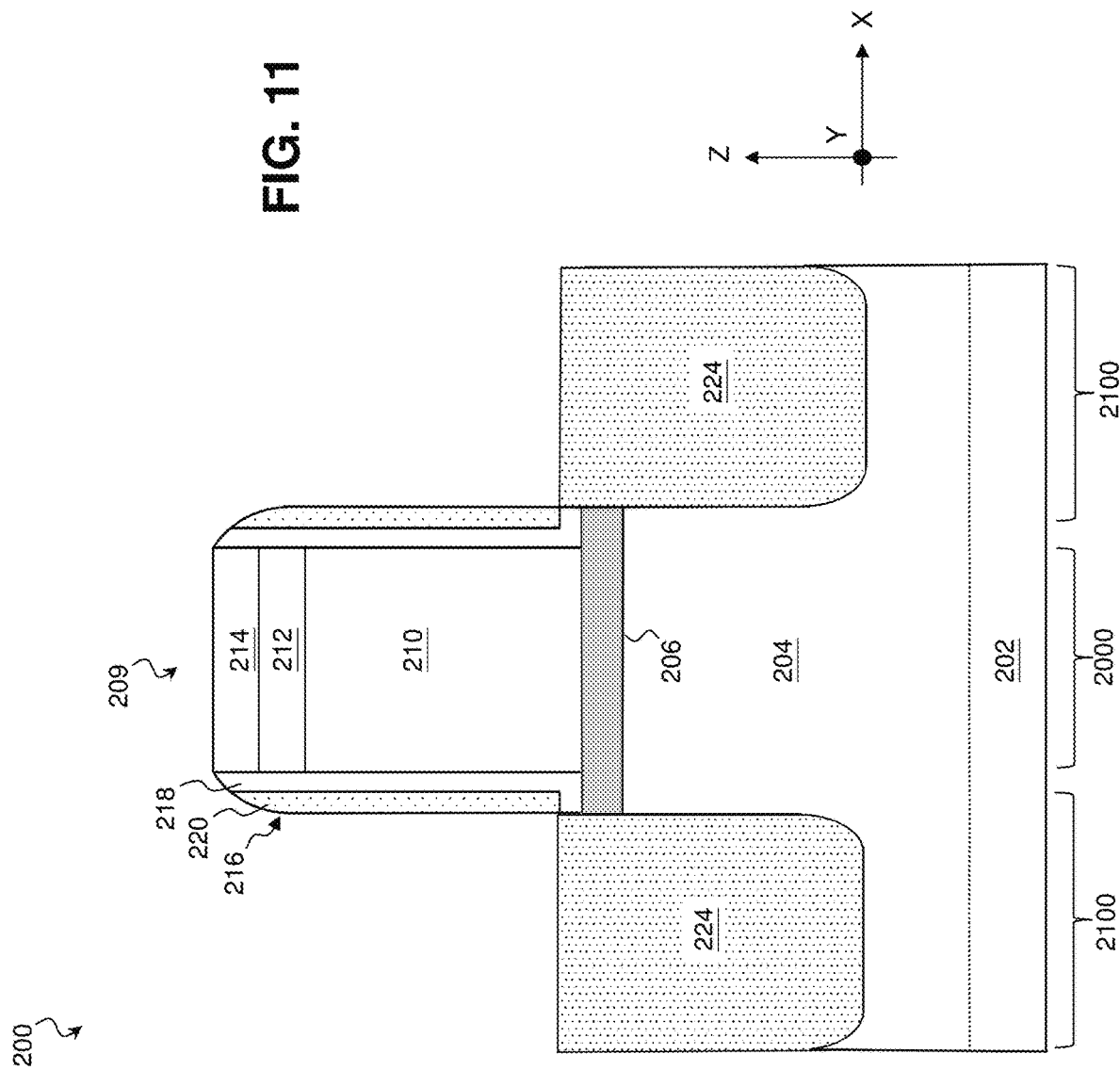

Referring now to FIGS. 1, 10 and 11, method 100 includes block 114 where source/drain features 224 are formed over source/drain regions 2100 of the fin 204. Source/drain features 224 are formed on opposing sides of the dummy gate structure 209. The source/drain features 224 may be formed by recessing a portion of the fins 204 to form source/drain recesses 222 and depositing material in the recesses 222 using an epitaxy technique (e.g., Vapor-Phase Epitaxy (VPE) and/or Ultra-High Vacuum CVD (UHV-CVD)), molecular beam epitaxy, and/or other suitable processes. The epitaxy process may use gaseous and/or liquid precursors, which interact with a component of the remaining portions of the fins 204 (e.g., silicon or silicon-germanium) to form the source/drain features 224. The semiconductor component of the source/drain features 224 may be similar to or different from the remainder of the fin 204. For example, Si-containing source/drain features 224 may be formed on a SiGe-containing fin 204 or vice versa. When the source/drain features 224 and fins 204 contain more than one semiconductor materials, the ratios may be substantially similar or different. In some embodiments, a top surface pf the source/drain feature 224 may be higher than a top surface of the first ferroelectric layer 206 by between about 2 nm and about 10 nm.

The source/drain features 224 may be in-situ doped to include p-type dopants, such as boron, $BF_2$, or indium; n-type dopants, such as phosphorus or arsenic; and/or other suitable dopants including combinations thereof. Additionally or in the alternative, the source/drain features 224 may be doped using an implantation process (i.e., a junction implant process) after the source/drain features 224 are formed. With respect to the particular dopant type, the source/drain features 224 are doped to be of opposite type than the remainder of the fins 204. For a p-channel device, the fin 204 is doped with an n-type dopant and the source/drain features 224 are doped with a p-type dopant, and vice versa for an n-channel device. Once the dopant(s) are introduced into the source/drain features 224, a dopant activation process, such as Rapid Thermal Annealing (RTA) and/or a laser annealing process, may be performed to activate the dopants.

Figure 12:
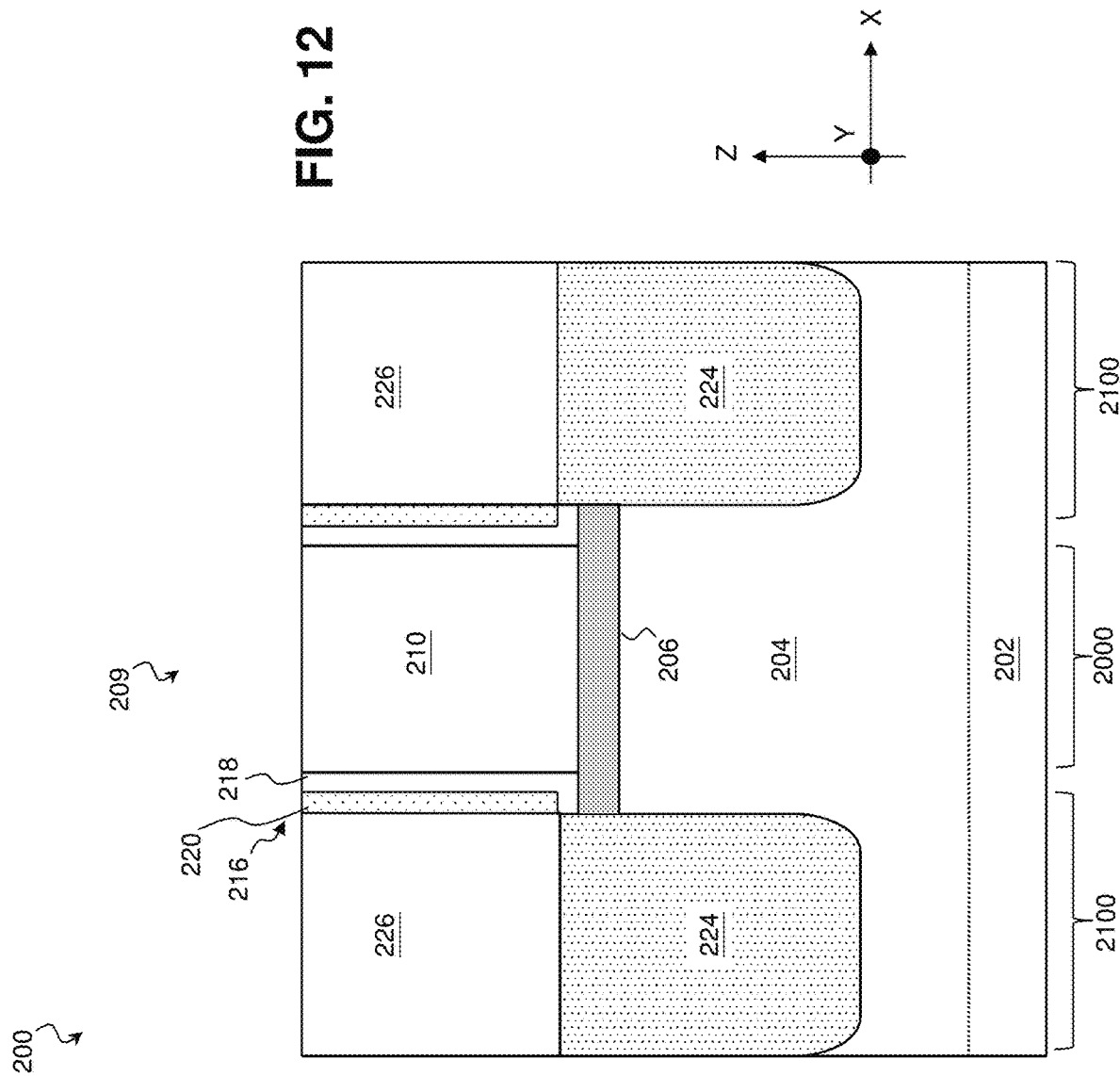

Referring now to FIGS. 1 and 12, method 100 proceeds to block 116 where an interlayer (inter-level) dielectric layer (ILD) 226 (or ILD 226) is deposited over the workpiece 200. The ILD layer 226 acts as an insulator that supports and isolates conductive traces of an electrical multi-level interconnect structure. In turn, the multi-level interconnect structure electrically interconnects elements of the workpiece 200, such as the source/drain features 224 and the functional gate electrodes. The ILD layer 226 may be formed by any suitable process including CVD, PVD, spin-on deposition, and/or other suitable processes. The ILD layer 226 may include a dielectric material (e.g., a semiconductor oxide, a semiconductor nitride, a semiconductor oxynitride, a semiconductor carbide, etc.), Spin-On-Glass (SOG), fluoride-doped silicate glass (FSG), phosphosilicate glass (PSG), borophosphosilicate glass (BPSG), Black Diamond® (Applied Materials of Santa Clara, Calif.), Xerogel, Aerogel, amorphous fluorinated carbon, parylene, BCB, SILK® (Dow Chemical of Midland, Mich.), and/or combinations thereof. A Chemical Mechanical Planarization/Polishing (CMP) process may be performed following the deposition of the ILD layer 226 to planarize the ILD layer 226, the gate spacer 216, and the dummy gate structure 209. In particular, the CMP process may remove the first and second gate hard masks 212 and 214 from the top of the dummy gate structure 209. In some other embodiments, the CMP process does not remove the first and second gate hard masks 212 and 214 from the top of the dummy gate structure 209.

Figure 13:
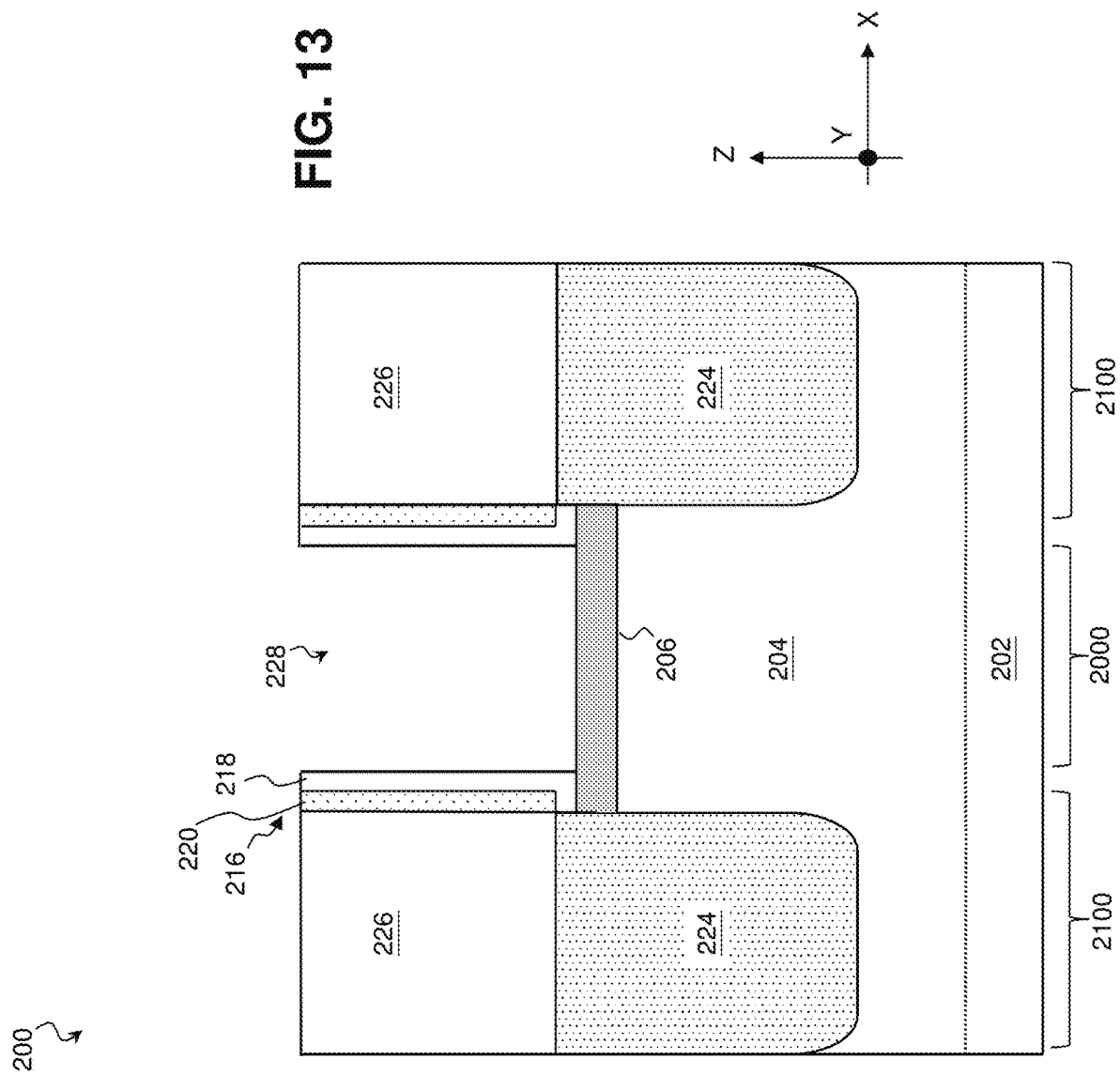

Referring now to FIGS. 1 and 13, method 100 includes block 118 where the dummy gate structure 209 is removed. The remaining dummy gate structure 209, such as the dummy gate electrode 210 (or any residual gate hard masks if any is left), is then removed. The dummy gate structure 209 may be removed using one or more iterations of various etching techniques, such as dry etching, wet etching, RIE, etc., each configured to selectively etch a particular material or set of materials of the dummy gate structure 209. Removing the dummy gate structure 209 forms a recess 228 between the gate spacers 216 to expose the first ferroelectric layer 206 on the channel region 2000 of the fin 204.

Figure 14:
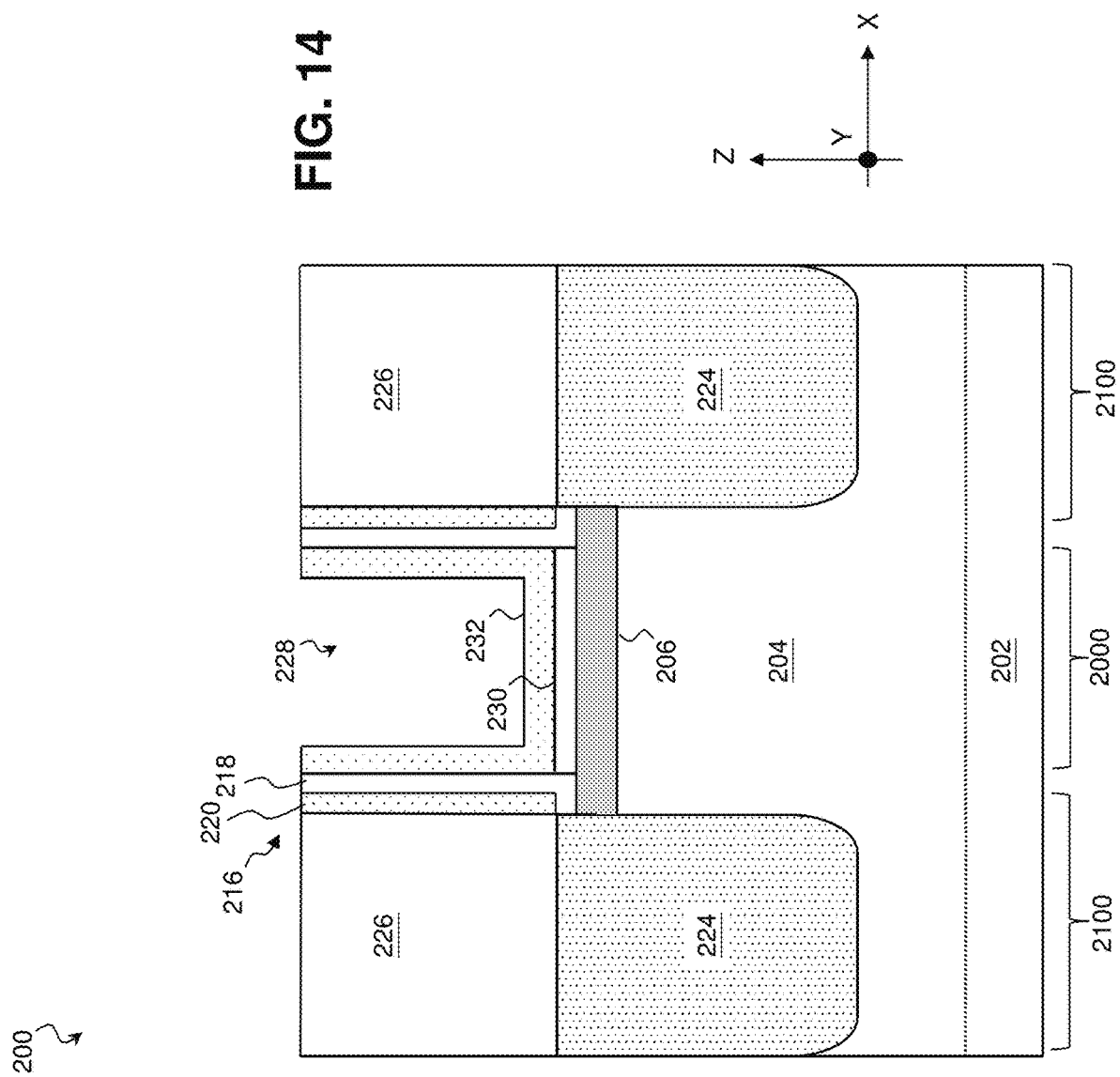

Referring now to FIGS. 1 and 14, method 100 includes block 120 where an interfacial layer 230 is deposited over the first ferroelectric layer 206 in the channel region 2000. In some embodiments, the interfacial layer 230 is formed on the first ferroelectric layer 206 exposed in the recess 228 to promote adhesion between it and the subsequent second ferroelectric layer 232 (to be described further below) and to reduce defects at the interfaces. The interfacial layer 230 may include an interfacial material, such as a semiconductor oxide, semiconductor nitride, semiconductor oxynitride, other semiconductor dielectrics, metal oxides, other suitable interfacial materials, and/or combinations thereof. The interfacial layer 230 may be formed to any suitable thickness using any suitable process including thermal growth, ALD, CVD, HDP-CVD, PVD, spin-on deposition, and/or other suitable deposition processes.

Referring now to FIGS. 1 and 14, method 100 includes block 122 where a second ferroelectric layer 232 is deposited over the interfacial layer 230. In some embodiments represented in FIG. 14, the second ferroelectric layer 232 is formed in the recess 228 between the gate spacers 216 and over the interfacial layer 230. In those embodiments, the second ferroelectric layer 232 is formed on the top and sides surfaces (sidewalls) of fin(s) 204 in the channel regions 2000. This may be done without forming the second ferroelectric layer 232 on, for example, the top of the isolation feature 208 or on the side surfaces (sidewalls) of the gate spacers 216. The second ferroelectric layer 232 may include a metal oxide ferroelectric dielectric such as $HfO_2$, HfYOx, HfSrOx, HfGdOx, HfSiO$_x$, HfZrO$_x$, HfAlO$_x$, BaTiO$_x$, $Al_2O_3$, $TiO_2$, LaO$_x$, BaSrTiO$_x$ (BST), PbZr$_x$Ti$_y$O$_z$ (PZT), or other metal oxides. Different from the material for the first ferroelectric layer 206, the material for the second ferroelectric layer 232 is a metal oxide and has a perovskite structure in order to exhibit ferroelectricity. In cases where a ferroelectric material for the second ferroelectric layer 232 shares the same chemical formula with a high-k dielectric material, the ferroelectric material has a perovskite structure and exhibits ferroelectricity, and the high-k dielectric material counterpart does not. It is also noted that the second ferroelectric layer 232 is different from the first ferroelectric layer 206 in that it does not has semiconductor property. The second ferroelectric layer 232 may be formed by implantation, doping, sputtering, PVD, CVD, PECVD, HDP-CVD, and/or other suitable techniques and may be formed to any suitable thickness. The second ferroelectric layer 232 is therefore formed using a process different from that for forming the first ferroelectric layer 206.

Figure 15:
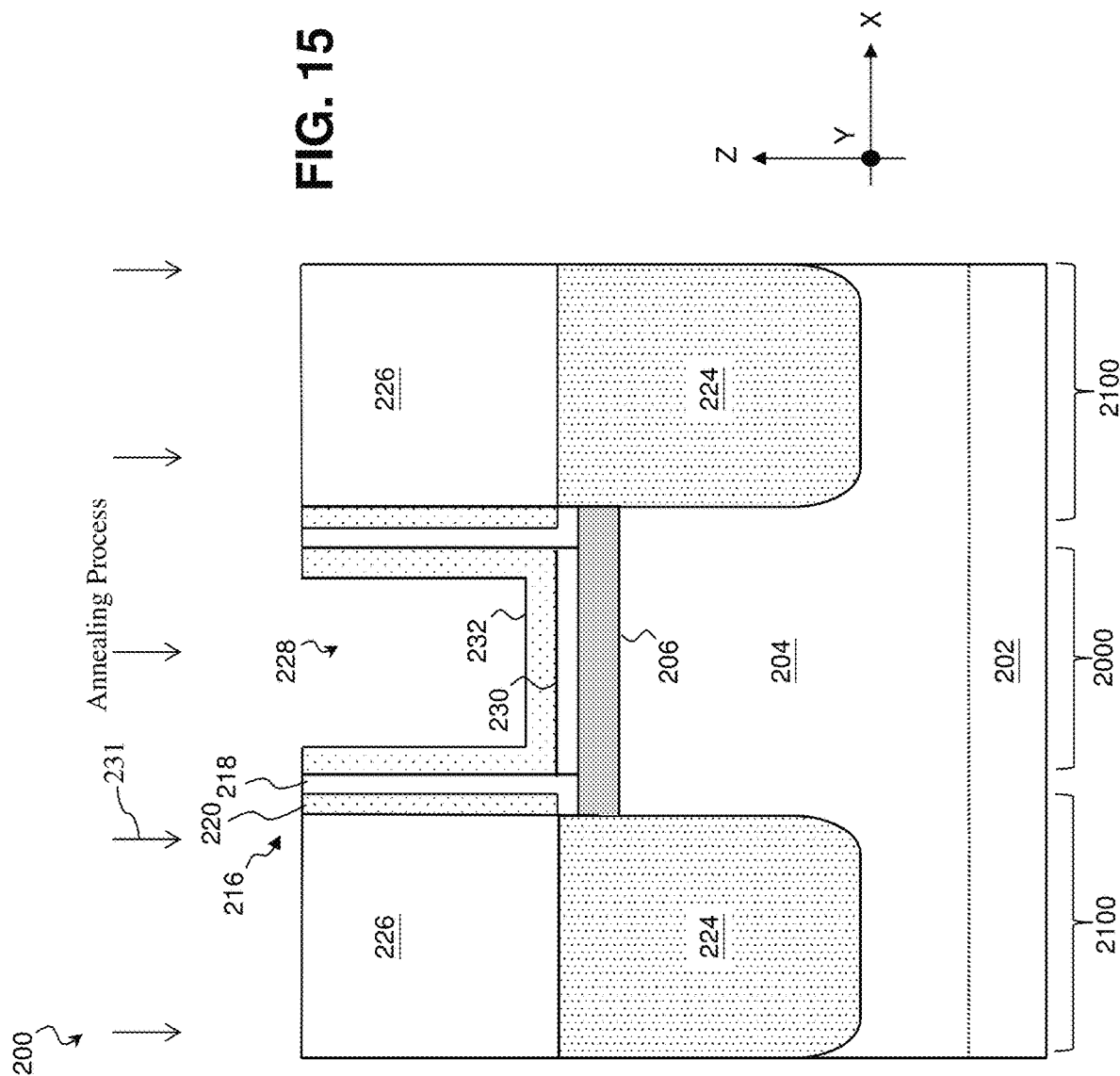

Referring now to FIGS. 1 and 15, method 100 proceeds to block 124 where an anneal process 231 is performed. In some embodiments, the anneal process 231 is performed after depositing the second ferroelectric layer 232. The ferroelectric property of the second ferroelectric layer 232 may be affected by various factors including, and not limited to, the elements contained, the percentage of the elements, and the phase of the resulting crystal structure. Accordingly, the ferroelectric property of the second ferroelectric layer 232 may depend on the deposition process conditions and the post-treatment conditions for forming the second ferroelectric layer 232. Accordingly, even if a material has the same elements and same percentages of the elements as the second ferroelectric layer 232, this material is not necessarily a ferroelectric material. For example, the formation conditions and the subsequent anneal process can affect whether the ferroelectric property can be achieved or not. The anneal process 231 may be any suitable anneal technique, such as Rapid Thermal Annealing (RTA) and/or a laser annealing process and may include an anneal temperature between about 100° C. and about 900° C. In some instances, because the anneal process 231 is performed after both the first ferroelectric layer 206 the second ferroelectric layer 232 are deposited, the anneal process 231 may be used to thermally treat both the first and second ferroelectric layers 206 and 232. In those instances, the anneal process 231 also anneal the first ferroelectric layer 206 to impart ferroelectric property in the first ferroelectric layer 206 or to enhance ferroelectric property in the first ferroelectric layer 206 and the anneal process 205 at block 106 may be omitted.

In some examples, the material of the second ferroelectric layer 232 has a higher dielectric constant/relative permittivity (i.e., k) than other suitable gate dielectrics. In some embodiments, to avoid leakage current between the gate and the channel, the second ferroelectric layer 232 may be supplemented by additional gate dielectric layers. Such additional gate dielectric layers may be formed on the interfacial layer 230 and may extend along the top surface of the isolation feature 208 and the side surface (or sidewall) of the gate spacers 216. The additional gate dielectric layer may include one or more dielectric materials, which are commonly characterized by their dielectric constant relative to silicon dioxide. In some implementations, the additional gate dielectric layer includes a high-k dielectric material, such as yttrium oxide ($Y_2O_3$), lanthanum oxide ($La_2O_5$), gadolinium oxide ($Gd_2O_5$), titanium oxide (TiO2), tantalum oxide ($Ta_2O_5$), erbium oxide ($Er_2O_3$), zirconium oxide (ZrO), aluminum oxide ($Al_2O_3$), HfErO, HfLaO, HfYO, HfGdO, HfAlO, HfZrO, HfTiO, HfTaO, or SrTiO, $HfO_2$, HfSiO, HfSiON, HfTaO, HfTiO, HfZrO, hafnium dioxide-alumina ($HfO_2$—$Al_2O_3$) alloy, other suitable high-k dielectric materials, and/or combinations thereof. Additionally or in the alternative, the additional gate dielectric layer may include other dielectrics, such as a semiconductor oxide, semiconductor nitride, semiconductor oxynitride, semiconductor carbide, amorphous carbon, TEOS, other suitable dielectric material, and/or combinations thereof. While the chemical formula of some of these materials, such as the exemplary high-k dielectric materials, may be similar to or the same as that of the second ferroelectric layer 232, the additional gate dielectric layer may not include a ferroelectric material.

In embodiments where the additional gate dielectric layer is used, the additional gate dielectric layer may be formed using any suitable process including ALD, PEALD, CVD, Plasma Enhanced CVD (PE CVD), HDP-CVD, PVD, spin-on deposition, and/or other suitable deposition processes. The additional gate dielectric layer may be formed to any suitable thickness, and in some examples, the additional gate dielectric layer has a thickness of between about 0.1 nm and about 3 nm.

Figure 16:
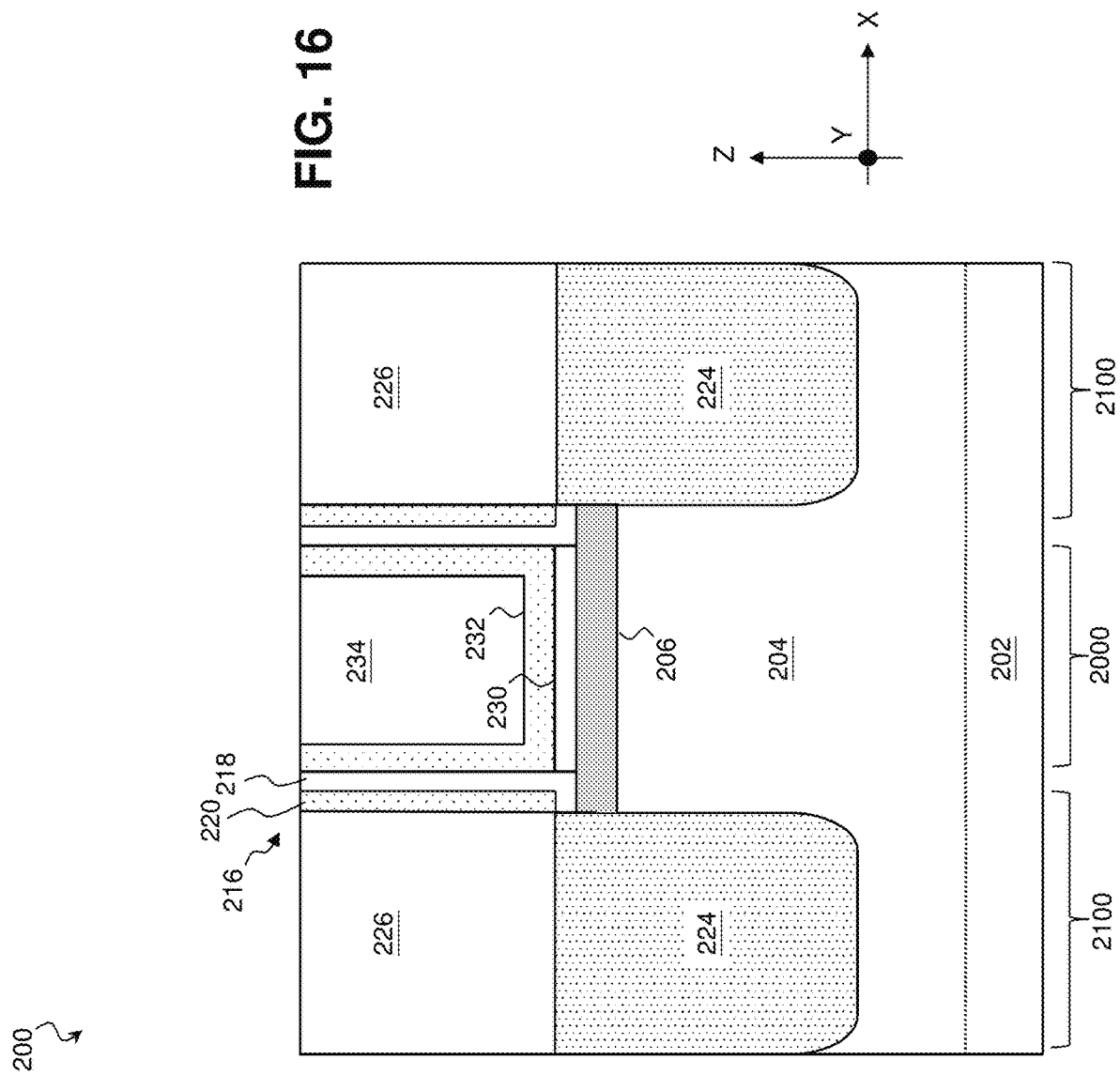
Figure 17:
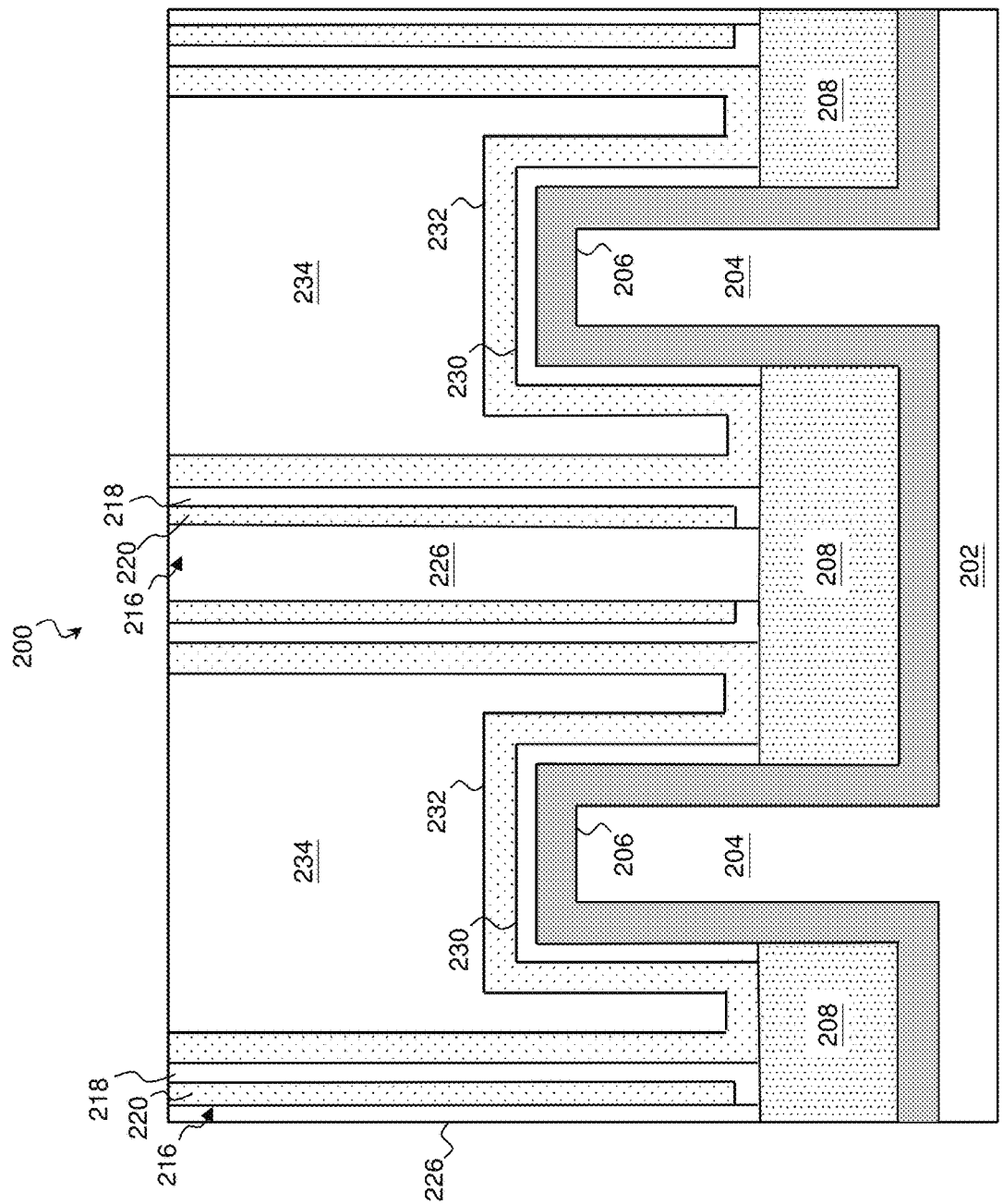

Referring now to FIGS. 1, 16 and 17, method 100 includes block 126 where a gate electrode 234 is deposited over the second ferroelectric layer 232. In some embodiments, the gate electrode 234 is formed on the second ferroelectric layer 232 above and between the fins 204. In those embodiments, as shown in FIGS. 16 and 17, the gate electrode 234 is in contact with the second ferroelectric layer 232 deposited over sidewalls of the gate spacer 216 and the channel region 2000 of the fin 204. The gate electrode 234 may include a number of different conductive layers, including capping layers, work function layers, and an electrode fill. For example, forming a gate electrode, such as the gate electrode 234, may include forming one or more capping layers on the second ferroelectric layer 232 to prevent migration of other gate materials into the second ferroelectric layer 232. The capping layer(s) may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition processes. In various embodiments, the capping layer(s) include TaSiN, TaN, and/or TiN.

In some examples, forming the gate electrode 234 includes forming one or more work function layers on the capping layer(s). Suitable work function layer materials include n-type and/or p-type work function materials based on the type of circuit device being formed. Exemplary p-type work function metals include TiN, TaN, Ru, Mo, Al, WN, ZrSi$_2$, MoSi$_2$, TaSi$_2$, NiSi$_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) may be deposited by any suitable technique including ALD, PEALD, CVD, PE CVD, PVD, and/or combinations thereof. Because the p-channel and n-channel devices may have different work function layers, in some examples, the p-type work function layers are deposited in a first deposition process that uses a dielectric hard mask to prevent depositing on the electrodes of the n-channel devices, and the n-type work function layers are deposited in a second deposition process that uses a dielectric hard mask to prevent depositing on the electrodes of the p-channel devices. In some instances, the electrode fill may be formed of Aluminum (Al), Tungsten (W), Copper (Cu), ruthenium (Ru), cobalt (Co), nickel (Ni), molybdenum (Mo), or combinations thereof.

Figure 18:
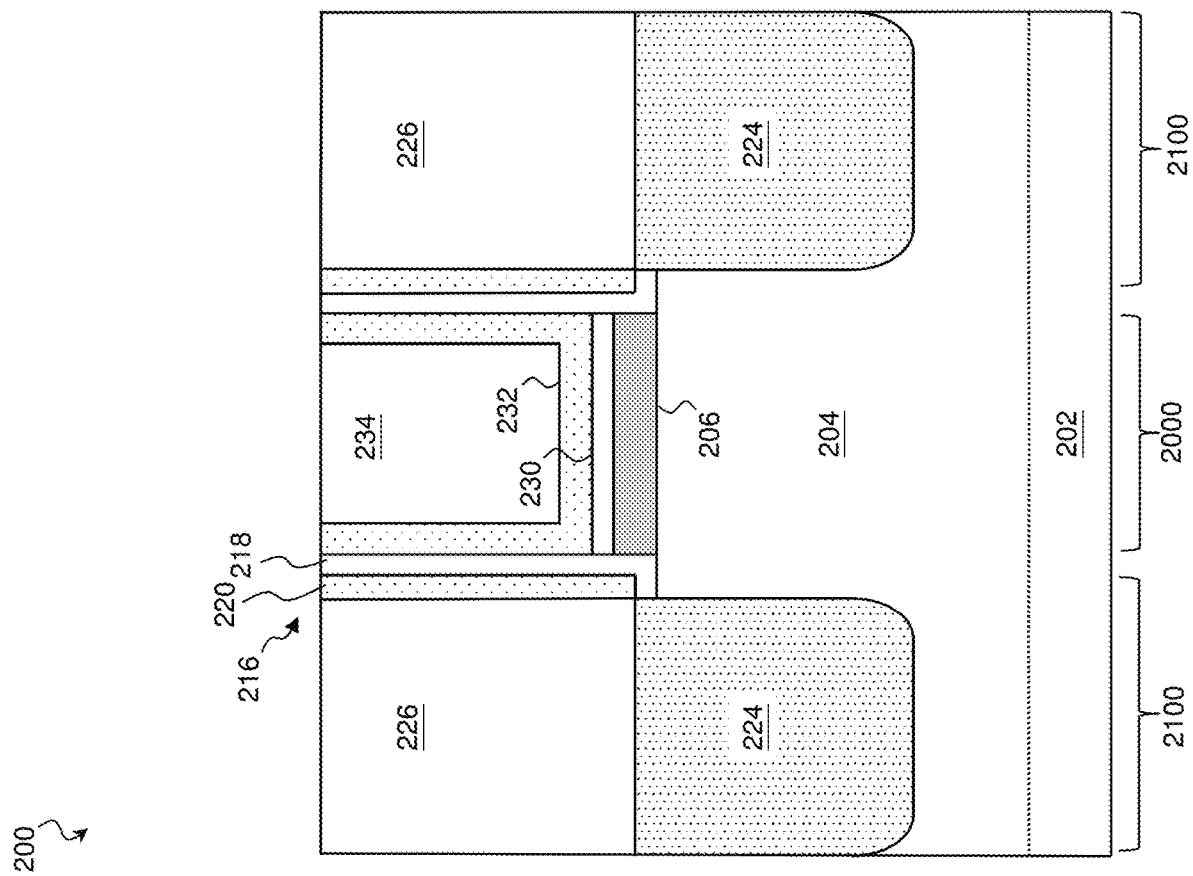

Reference is now made to FIG. 18. In some alternative embodiments, the first ferroelectric layer 206 not protected by the dummy gate structure 209 at block 110 may be optionally removed before the gate spacers 216 are formed. In these alternative embodiments, the gate spacers 216 are formed directly on the fin 204 and sidewalls of the first ferroelectric layer 206 are in contact with the gate spacers 216, such as the first gate spacer layer 218.

Referring now to FIG. 1, method 100 may include block 128 where further processes are performed. In various examples, this includes forming contacts coupling to the source/drain features 224 and to the functional gate electrode 234, forming a remainder of an electrical interconnect structure, dicing, packaging, and other fabrication processes. Accordingly, an integrated circuit on the workpiece 200 is provided that includes negative-capacitance field effect transistors.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is improved device performance. For example, the method of the present disclosure forms a transistor with two spaced-apart ferroelectric layers between the gate and the channel. A transistor formed using the method of the present disclosure includes a first ferroelectric layer that epitaxially formed on the channel (i.e. channel region of a fin in a FinFET), a second ferroelectric layer is deposited over an interfacial layer disposed over the first ferroelectric layer, and a gate electrode disposed on the second ferroelectric layer. Because the first ferroelectric layer and the second ferroelectric layer are positioned at different distances from the channel (the channel region of the fin), the first ferroelectric layer can produce a hysteresis curve to counteract the hysteresis curve of the second ferroelectric layer, thereby achieving a hysteresis-free FET or a substantially hysteresis-free FET.

The present disclosure provides embodiments of circuit devices and methods of forming the same. In one embodiment, a method is provided. The method includes receiving a workpiece that includes a substrate and a fin extending from the substrate, the fin including two source/drain regions and a channel region between the two source/drain regions, forming a first ferroelectric layer on the fin, forming a dummy gate structure over the channel region of the fin, forming a gate spacer over sidewalls of the dummy gate structure, forming an inter-level dielectric layer over the workpiece, removing the dummy gate structure to expose the first ferroelectric layer over the channel region of the fin, and forming a gate electrode over the exposed first ferroelectric layer over the channel region of the fin.

In some embodiments, the forming of the first ferroelectric layer includes epitaxially growing the first ferroelectric layer on the fin. In some embodiments, the first ferroelectric layer includes indium (In), selenium (Se), copper (Cu), phosphorous (P), strontium (Sr), titanium (Ti), oxygen (O), or sulfur (S), or a combination thereof. In some implementations, the method further includes forming an interfacial layer over the exposed first ferroelectric layer over the channel region, and forming a second ferroelectric layer over the interfacial layer. The forming of the gate electrode includes forming the gate electrode on the second ferroelectric layer. In some implementations, the forming of the second ferroelectric layer includes depositing the second ferroelectric layer using atomic layer deposition (ALD) or chemical vapor deposition (CVD). In some instances, the second ferroelectric layer is different from the first ferroelectric layer. In some embodiments, the method of claim further includes forming an isolation feature over the first ferroelectric layer.

In another embodiment, a method is provided. The method includes receiving a workpiece that includes a substrate and a fin extending from the substrate, the fin including two source/drain regions and a channel region between the two source/drain regions, epitaxially forming a first ferroelectric layer on the fin, forming a dummy gate structure over the channel region of the fin, forming a gate spacer over sidewalls of the dummy gate structure, forming an inter-level dielectric layer over the workpiece, removing the dummy gate structure to expose the first ferroelectric layer over the channel region of the fin, forming an interfacial layer over the exposed first ferroelectric layer over the channel region, forming a second ferroelectric layer over the interfacial layer, wherein the second ferroelectric layer is different from the first ferroelectric layer, and forming a gate electrode on the second ferroelectric layer.

In some embodiments, the method further includes performing an annealing process after the forming the first ferroelectric layer. In some implementations, the first ferroelectric layer includes indium selenide (In2Se3) or a transition metal thiophosphate. In some embodiments, the forming of the second ferroelectric layer includes depositing the second ferroelectric layer using atomic layer deposition (ALD) or chemical vapor deposition (CVD). In some implementations, the second ferroelectric layer includes $HfO_2$, HfSiOx, HfZrOx, Al2O3, TiO2, LaOx, BaSrTiOx (BST), or PbZrxTiyOz (PZT). In some instances, the method further includes performing an annealing process after the forming of the second ferroelectric layer. In some embodiments, the method further includes forming an isolation feature over the first ferroelectric layer. In some embodiments, the forming of the first ferroelectric layer includes epitaxially forming the first ferroelectric layer directly on the substrate.

In still another embodiment, a circuit device is provided. The circuit device includes a substrate, a fin extending from the substrate and having a pair of source/drain features and a channel region disposed between the pair of source/drain features, a first ferroelectric layer on the channel region of the fin, an isolation feature disposed over the substrate and alongside the fin such that the fin extends above the isolation feature, an interfacial layer over the first ferroelectric layer, a second ferroelectric layer over the interfacial layer, and a gate electrode disposed on the second ferroelectric layer.

In some embodiments, the first ferroelectric layer and the second ferroelectric layer are in physical contact with the isolation feature. In some implementations, a portion of the first ferroelectric layer is disposed on the substrate. In some instances, a portion of the isolation feature is disposed between the first ferroelectric layer and the second ferroelectric layer. In some embodiments, the first ferroelectric layer includes indium selenide (In2Se3) or copper indium thiophosphate (CuInP2S6).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
receiving a workpiece that includes:
a substrate, and
a fin extending from the substrate, the fin including two source/drain regions and a channel region between the two source/drain regions;
forming a first ferroelectric layer on the fin;
forming a dummy gate structure over the channel region of the fin;
forming a gate spacer over sidewalls of the dummy gate structure;
forming an inter-level dielectric layer over the workpiece;
removing the dummy gate structure to expose the first ferroelectric layer over the channel region of the fin;
forming an interfacial layer over the exposed first ferroelectric layer over the channel region of the fin; and
forming a gate electrode over the interfacial layer.

2. The method of claim 1, wherein the forming of the first ferroelectric layer comprises epitaxially growing the first ferroelectric layer on the fin.

3. The method of claim 1, wherein the first ferroelectric layer comprises indium (In), selenium (Se), copper (Cu), phosphorous (P), strontium (Sr), titanium (Ti), and oxygen (O), or sulfur (S), or a combination thereof.

4. The method of claim 1, further comprising:
before the forming of the gate electrode, forming a second ferroelectric layer over the interfacial layer.

5. The method of claim 4, wherein the forming of the second ferroelectric layer comprises depositing the second ferroelectric layer using atomic layer deposition (ALD) or chemical vapor deposition (CVD).

6. The method of claim 4, wherein the second ferroelectric layer is different from the first ferroelectric layer.

7. The method of claim 1, further comprising forming an isolation feature over the first ferroelectric layer.

8. A method comprising:
receiving a workpiece that includes:
a substrate; and
a fin extending from the substrate, the fin including two source/drain regions and a channel region between the two source/drain regions;
epitaxially forming a first ferroelectric layer on the fin;
forming a dummy gate structure over the channel region of the fin;
forming a gate spacer over sidewalls of the dummy gate structure;
forming an inter-level dielectric layer over the workpiece;
removing the dummy gate structure to expose the first ferroelectric layer over the channel region of the fin;
forming an interfacial layer over the exposed first ferroelectric layer over the channel region;
forming a second ferroelectric layer over the interfacial layer, wherein the second ferroelectric layer is different from the first ferroelectric layer; and
forming a gate electrode on the second ferroelectric layer.

9. The method of claim 8, further comprising performing an annealing process after the forming the first ferroelectric layer.

10. The method of claim 8, wherein the first ferroelectric layer comprises indium selenide ($In_2Se_3$) or a transition metal thiophosphate.

11. The method of claim 8, wherein the forming of the second ferroelectric layer comprises depositing the second ferroelectric layer using atomic layer deposition (ALD) or chemical vapor deposition (CVD).

12. The method of claim 8, wherein the second ferroelectric layer comprises $HfO_2$, $HfSiO_x$, $HfZrO_x$, $Al_2O_3$, $TiO_2$, $LaO_x$, $BaSrTiO_x$, (BST), or $PbZr_xTi_yO_z$ (PZT).

13. The method of claim 8, further comprising performing an annealing process after the forming of the second ferroelectric layer.

14. The method of claim 8, further comprising forming an isolation feature over the first ferroelectric layer.

15. The method of claim 8, wherein the forming of the first ferroelectric layer comprises epitaxially forming the first ferroelectric layer directly on the substrate.

16. A method, comprising:
depositing a first ferroelectric layer over a fin disposed on a substrate using a first method;
forming an interfacial layer over the first ferroelectric layer;
depositing a second ferroelectric layer over the interfacial layer using a second method different from the first method; and
forming a gate electrode over the second ferroelectric layer,
wherein a composition of the first ferroelectric layer is different from a composition of the second ferroelectric layer.

17. The method of claim 16,
wherein the first method comprises vapor-phase epitaxy (VPE) or molecular beam epitaxy (MBE),
wherein the second method comprises physical vapor deposition (PVD), chemical vapor deposition (CVD), plasma-enhanced CVD (PECVD), or high-density-plasma CVD (HDPCVD).

18. The method of claim 16,
wherein the first ferroelectric layer does not include a perovskite structure,
wherein the second ferroelectric layer includes a perovskite structure.

19. The method of claim 16,
wherein the first ferroelectric layer includes semiconductor property,
wherein the second ferroelectric layer does not include semiconductor property.

20. The method of claim 16,
wherein the first ferroelectric layer does not include oxygen,
wherein the second ferroelectric layer includes oxygen.

* * * * *